United States Patent
Li et al.

(10) Patent No.: US 7,829,923 B2
(45) Date of Patent: Nov. 9, 2010

(54) MAGNETIC TUNNEL JUNCTION AND METHOD OF FABRICATION

(75) Inventors: Xia Li, San Diego, CA (US); Seung H. Kang, San Diego, CA (US); Xiaochun Zhu, San Diego, CA (US); Kangho Lee, San Diego, CA (US); Matthew Nowak, San Diego, CA (US)

(73) Assignee: QUALCOMM Incorporated, San Diego ( * ) Notice: Subject to any disclaimer, the term of this patent is extended or adjusted under 35 U.S.C. 154(b) by 0 days.

(21) Appl. No.: 12/256,487

(22) Filed: Oct. 23, 2008

(65) Prior Publication Data

US 2010/0102404 A1   Apr. 29, 2010

(51) Int. Cl.
*H01L 27/108* (2006.01)
(52) U.S. Cl. .............................. 257/295; 257/E29.272; 257/E29.104
(58) Field of Classification Search .................. 257/295, 257/E29.272, E29.104, E29.164, E21.208, 257/E21.436, E21.663, E21.664
See application file for complete search history.

(56) References Cited

U.S. PATENT DOCUMENTS 6,891,715 B2 * 5/2005 Mikawa et al. .............. 361/311
7,326,982 B2 * 2/2008 Iwata et al. .................. 257/296
2002/0021544 A1* 2/2002 Cho et al. .................... 361/200
2003/0030084 A1* 2/2003 Moise et al. ................. 257/295
2004/0135184 A1* 7/2004 Motoyoshi .................. 257/295
2005/0090111 A1 4/2005 Lee
2006/0014305 A1 1/2006 Lee
2007/0164265 A1 7/2007 Kajiyama

FOREIGN PATENT DOCUMENTS

WO   2005004161   1/2005

OTHER PUBLICATIONS

International Search Report-PCT/US2009/061438, International Search Authority-European Patent Office Feb. 19, 2010.
Written Opinion-PCT/ US2009/061438, International Search Authority-European Patent Office Feb. 19, 2010.

* cited by examiner

*Primary Examiner*—Kenneth A Parker
*Assistant Examiner*—Paul E Patton
(74) *Attorney, Agent, or Firm*—Sam Talpalatsky; Nicholas J. Pauley; Peter M. Kamarchik

(57) ABSTRACT

In a particular embodiment, a method of forming a magnetic tunnel junction (MTJ) device includes applying a dielectric layer to a surface, applying a metal layer to the dielectric layer, and adding a cap layer on the dielectric layer. The method also includes forming a magnetic tunnel junction (MTJ) stack such that an electrode of the MTJ stack is disposed on the metal layer and the cap layer contacts a side portion of the metal layer. An adjustable depth to via may connect a top electrode of the MTJ stack to a top metal.

24 Claims, 4 Drawing Sheets

MAGNETIC TUNNEL JUNCTION AND METHOD OF FABRICATION

FIELD

The present disclosure is generally related to a method of forming a magnetic tunnel junction (MTJ) structure.

DESCRIPTION OF RELATED ART

In general, widespread adoption of portable computing devices and wireless communication devices has increased demand for high-density and low-power non-volatile memory. As process technologies have improved, it has become possible to fabricate magnetoresistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells. An MTJ cell typically includes a bottom electrode, an anti-ferromagnetic layer, a fixed layer (e.g., a reference layer formed from a ferromagnetic material that carries a magnetic field having a fixed or pinned orientation by the anti-ferromagnetic (AF) layer), a tunnel barrier layer (e.g., a tunneling oxide layer), a free layer (e.g., a second ferromagnetic layer that carries a magnetic field having a changeable orientation), and a top electrode. The MTJ cell represents a bit value by a magnetic field induced in the free layer. A direction of the magnetic moment of the free layer relative to a direction of a fixed magnetic moment of the fixed layer determines the bit value.

Typically, the magnetic tunnel junction (MTJ) cell is formed by depositing multiple layers of material, by defining a pattern onto the layers, and by selectively removing portions of the layers according to the pattern. The MTJ cells in a MRAM are interconnected with bottom metal lines and top metal lines. The MRAM may include other metal lines disposed between the top metal lines of interconnecting the MTJ cells.

SUMMARY

In a particular embodiment, a method of fabricating a magnetic tunnel junction (MTJ) device is disclosed. The method includes applying a metal layer to a surface, applying a dielectric layer to the metal layer, adding a cap layer on the dielectric layer, and forming a magnetic tunnel junction (MTJ) stack such that an electrode of the MTJ stack is disposed on the metal layer and the cap layer contacts a side portion of the metal layer.

In another particular embodiment, the method of fabricating a magnetic tunnel junction (MTJ) device includes forming an MTJ stack, opening a portion of a dielectric layer and a cap layer to reach a top of the MTJ stack, depositing an electrical material into the opened portion of the dielectric layer and of the cap layer to apply a first electrode to the top of the MTJ stack. The method also includes patterning the first electrode and depositing a middle cap layer on the patterned first electrode. The method further includes opening a portion of the dielectric layer and the middle cap layer to reach the patterned first electrode and adding an electrical via and a metal layer to the first electrode.

In another particular embodiment, a device is disclosed that includes a metal layer, a dielectric layer on the metal layer, and a cap layer on the dielectric layer. The device also includes a magnetic tunnel junction (MTJ) stack formed such that a bottom electrode of the MTJ stack is disposed on the metal layer. The cap layer contacts a side portion of the metal layer.

In another particular embodiment, a device is disclosed that includes a magnetic tunnel junction (MTJ) structure. The device also includes a dielectric layer and a cap layer that have openings therein to reach a top portion of the MTJ structure. The device further includes a top electrode formed by an electrical material deposited into the openings of the dielectric layer and of the cap layer to contact the top portion of the MTJ structure. An electrical via and a metal layer are in electrical contact with the top electrode.

One particular advantage provided by at least one of the disclosed embodiments is an improvement of product yield due to a reduction of conductive paths bridging adjacent metal lines. Another particular advantage provided by at least one of the disclosed embodiments is an improvement in product yield due to a reduction in damage to logic elements caused by interlayer dielectric etching. Another particular advantage provided by at least one of the disclosed embodiments is sub-65 nm device integration using an adjustable top via connected to an MTJ.

Other aspects, advantages, and features of the present disclosure will become apparent after review of the entire application, including the following sections: Brief Description of the Drawings, Detailed Description, and the Claims.

DETAILED DESCRIPTION

Figure 1:
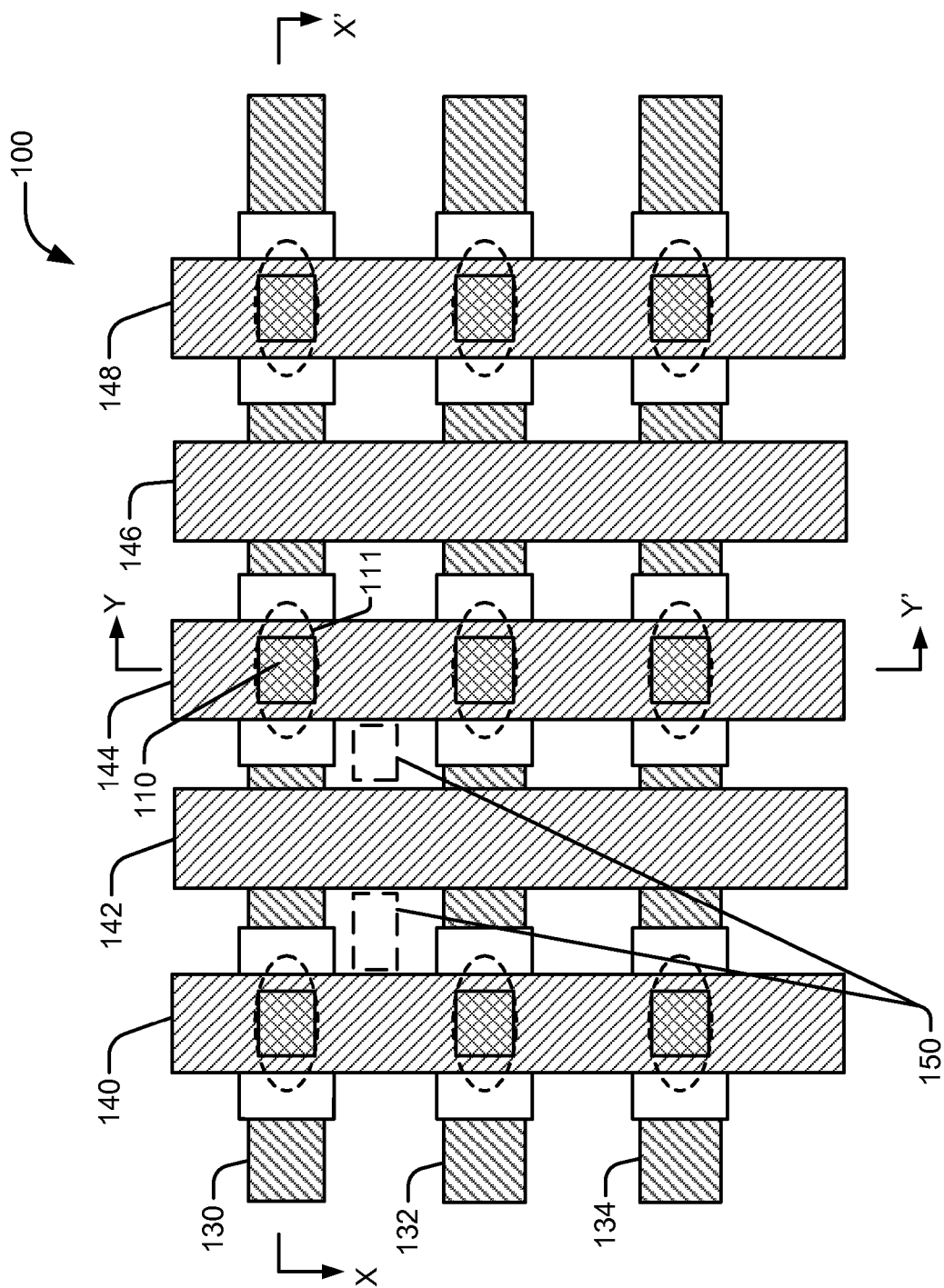
FIG. 1 is a top view diagram of a particular illustrative embodiment of a magnetoresistive random access memory (MRAM) including multiple magnetic tunnel junction (MTJ) cells.

Referring to FIG. 1, a top view diagram of a particular illustrative embodiment of a magnetoresistive random access memory (MRAM) 100 including multiple magnetic tunnel junction (MTJ) cells is depicted. The MRAM 100 includes multiple MTJ cells, such as a representative MTJ cell 111. The MTJ cells are arranged in a substantially regular grid and coupled at a top surface to conductive lines, such as representative top metal wires 140, 144, and 148. The MTJ cells are also coupled at a bottom surface to bottom conductive lines, such as a representative bottom metal wires 130, 132, and 134. Additional top conductive lines, such as representative second top metal wires 142 and 146, are positioned between the top conductive lines 140, 144, and 148 that are coupled to the MTJ cells. The additional top conductive lines 142 and 146 may carry, for example, signaling information and may be electrically isolated from neighboring top conductive lines 140, 144, and 148 via dielectric material.

The MTJ cells of the MRAM 100 are fabricated by a process that does not significantly compromise an integrity of the dielectric material at areas that may be sensitive to failures, such as the representative regions 150. For example, insufficient or difficult filling of oxide gaps between MTJs and/or overetching of the dielectric material in the regions 150 may allow metal material from the top wire formation process to accumulate within the region 150 and to potentially cause a short circuit between adjacent top wires, such as between the top wires 140 and 142 or between the top wires 142 and 144. As will be discussed with respect to FIGS. 4-5, the MTJ cells of the MRAM 100 are coupled to the top conductive lines 140, 144, and 148 using top vias, such as a representative top via 110 extending through a dielectric material and a protective cap layer of the MTJ 111. By using top vias for selective opening, overetching of the dielectric material in the regions 150 may be avoided. As a result, yield losses due to short circuits between adjacent top metal wires, such as between the top metal wires 140 and 142, due to metal material in the regions 150 may be circumvented.

Figure 2:
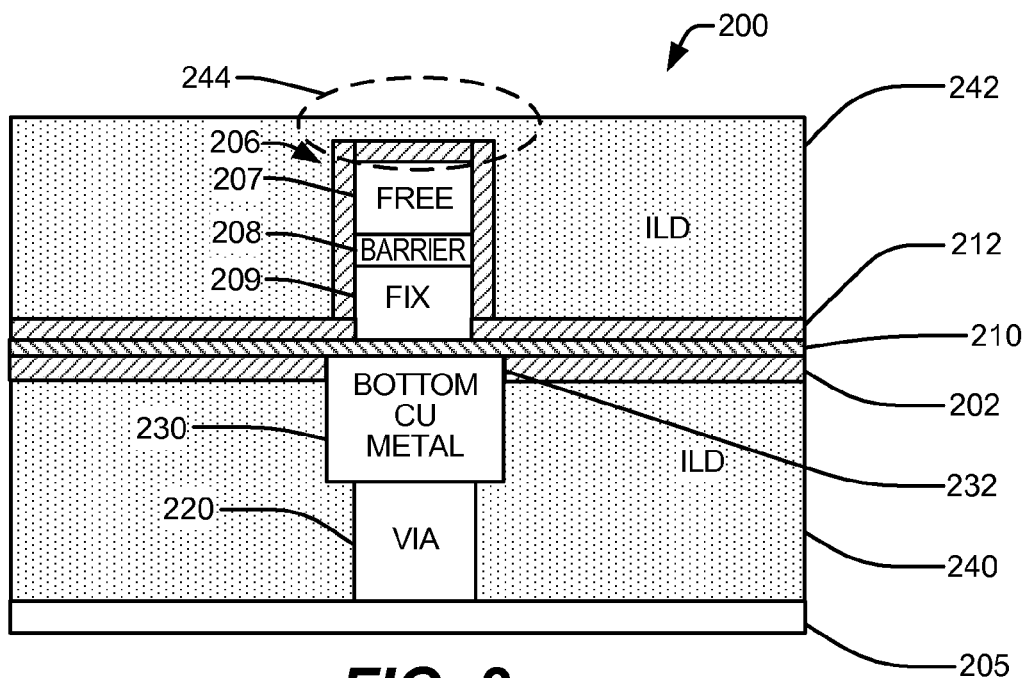
FIG. 2 is a cross-sectional diagram of a particular illustrative embodiment of a MTJ cell at a first processing stage.

Referring to FIG. 2, a cross-sectional diagram of a particular illustrative embodiment of a MTJ cell 200 at a first processing stage is shown. The MTJ cell 200 includes a MTJ stack 206 on a bottom electrode 210. The bottom electrode 210 is disposed on a bottom metal layer that includes a bottom metal landing or wire 230 that is coupled to a bottom line 205 by a via 220. A bottom inter-layer dielectric (ILD) layer 240 is disposed on an upper surface of the bottom line 205 and encompasses the via 220 and the wire 230. A bottom cap layer 202 is disposed on the bottom ILD layer 240 such that the bottom cap layer 202 contacts a side portion 232 of the metal layer, such as a side wall of the landing or wire 230. A second cap layer 212 is disposed on the bottom electrode 210 and the MTJ stack 206, and a second ILD layer 242 is disposed on the second cap layer 212.

The MTJ stack 206 includes a free layer 207, a barrier layer 208, and a fixed layer 209. Although the MTJ stack 206 is depicted as having three layers for illustrative purposes, the MTJ stack 206 may include additional layers, such as an antiferromagnetic layer, a top or bottom metal layer, etc. The MTJ stack 206 may also include one or more synthetic layers.

The MTJ cell 200 at the first processing step depicted in FIG. 2 may be formed by applying the bottom ILD layer 240 to the surface of the bottom line 205 and between adjacent bottom lines within a same metal layer as the bottom line 205, such as the bottom lines 130, 132, and 134 depicted in FIG. 1. The bottom cap layer 202 may be deposited on a top surface of the bottom ILD layer 240.

The bottom metal layer including the bottom metal landing or wire 230 and also the via 220 may be formed using a damascene process. A photolithography and etching (photo/etch) process may be used to form openings in the bottom cap layer 202 and to form one or more cavities or openings in the bottom ILD layer 240 that are shaped to accommodate the via 220 and the bottom metal landing or wire 230. Conductive material may be applied to the bottom dielectric layer 240 within the cavities to form the conductive via 220 and the bottom metal landing or wire 230 of the bottom metal layer. For example, applying the conductive material may include depositing copper material to substantially fill the openings of the bottom cap layer 202 and of the bottom ILD layer 240.

The bottom electrode 210 may be formed after a polishing process such as a chemical-mechanical planarization (CMP) process to make a top surface of the bottom metal layer substantially planar with a top surface of the bottom cap layer 202. The bottom electrode 210 may be formed of conductive material such as metal that is deposited such that the bottom electrode 210 is disposed on the bottom metal landing or wire 230 of the bottom metal layer.

The MTJ stack 206 may be formed by depositing successive layers, such as the fixed layer 209, the barrier layer 208, and the free layer 207. The layers 207-209 may be patterned using a photo/etch process and the second cap layer 212 applied. The second cap layer 212 may be added on the MTJ stack 206 and the second ILD layer 242 may be added on the second cap layer 212. As will be discussed with respect to FIG. 3, a top electrode of the MTJ stack 206 may be formed by opening a portion of the second ILD layer 242 and the second cap layer 212 to reach the top of the MTJ stack 206, such as by removing ILD material and cap material within a region 244.

Forming the via 220 and the bottom metal landing or wire 230 by etching through the bottom cap layer 202 and the bottom ILD layer 240 so that the bottom cap layer 202 contacts the side portion 232 of the bottom metal layer enables utilization of the bottom cap layer 202 as an etch stop and CMP stop and thus avoids or reduces ILD and logic metal damage that may otherwise be caused by overetching into the ILD 240 or overpolishing into the ILD 240, as will be discussed further with respect to FIG. 3.

Figure 3:
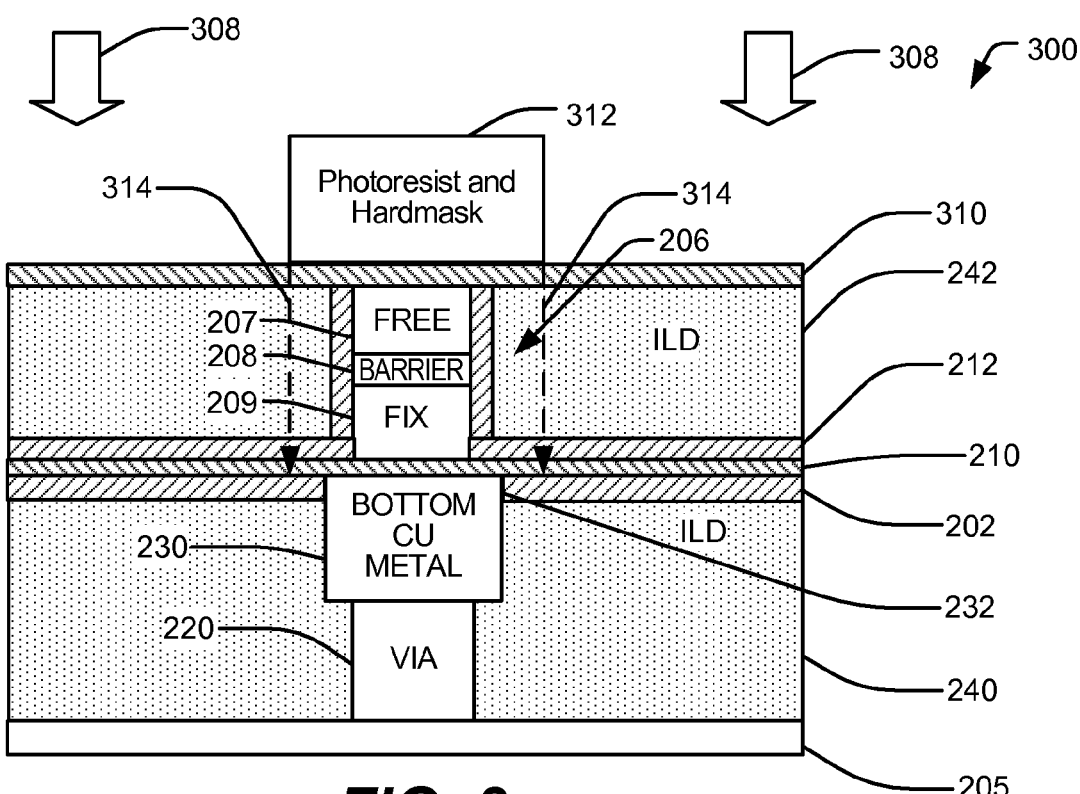
FIG. 3 is a cross-sectional diagram of the MTJ cell of FIG. 2 at a second processing stage.

FIG. 3 depicts a cross-sectional diagram of the MTJ cell of FIG. 2 at a second processing stage. The MTJ cell 300 at the second processing stage includes the bottom metal layer with the bottom metal landing or wire 230, the bottom conductive line 205, and the bottom via 220. The bottom ILD layer 240 is disposed on the surface of the bottom conductive line 205 and between adjacent conductive lines and is further in contact with sidewalls of the via 220 and sidewalls of the bottom metal landing or wire 230. The bottom cap layer 202 is disposed on the bottom ILD layer 240 and contacts a side portion 232 of the bottom metal layer at sidewalls of the bottom metal landing or wire 230. The bottom electrode 210 is disposed on the bottom metal layer and the bottom cap layer 202. The MTJ stack 206 including the free layer 207, the barrier layer 208, and the fixed layer 209 and an antiferromagnetic layer (not shown) is disposed on an upper surface of the bottom electrode 210. The second cap layer 212 is disposed on the MTJ stack 206 and the second ILD layer 242 is disposed on the second cap layer 212.

A top electrode 310 is disposed on a top surface of the MTJ stack 206, the second cap layer 212, and the second ILD layer 242. A photoresist and hardmask element 312 is disposed on the top electrode 310 and is dimensioned to provide an etch boundary 314 for an electrode patterning etch.

The MTJ cell 300 may be formed from the MTJ cell 200 of FIG. 2 by opening a portion of the second dielectric layer 242 and second cap layer 212 to reach a top of the MTJ stack 206, such as within the region 244 depicted in FIG. 2. For example, a CMP process may be performed to remove a top portion of the second ILD layer 242 and of the second cap layer 212 to expose a surface of the free layer 207. As another example, instead of applying a CMP process to remove a top of the second ILD layer 242 and the second cap layer 212 to expose the top of the MTJ stack 206, a blank photo/etchback process may be used to remove the second ILD layer 242 and the second cap layer 212 only within a region above the MTJ stack, such as the region 244 depicted in FIG. 2.

An electrical material 308 may be deposited into the opened portion of the second dielectric layer 242 and the second cap layer 212 to apply the top electrode 310 to the top of the MTJ stack 206. The photoresist and hardmask element 312 may be formed by applying photoresist and selectively removing portions of the photoresist and hardmask using a lithography/etching process to leave the photoresist and hardmask element 312. The photoresist and hardmask element 312 may be used to pattern the top electrode 310 and the bottom electrode 210 using an etch process that may generally remove electrode, ILD, and cap material outside etch boundaries 314 while substantially retaining materials within the etch boundaries 314.

The presence of the bottom cap layer 202 may serve as an etch stop to protect an integrity of the bottom ILD layer 240 during electrode patterning. For example, to ensure that the bottom electrode 210 is completely etched, the etch process may continue through the bottom electrode 210 and into a material beneath the bottom electrode 210. By using the bottom cap layer 202 as an etch stop, adequate etching of the bottom electrode 210 may be ensured and the bottom ILD layer 242 may be protected.

Using the bottom cap layer 202 to protect the materials under the bottom electrode 210 during a metal wire 230 CMP process and an MTJ electrode etching process may also protect logic portions (not shown) integrated with the MTJ cells. For example, a nearby logic area may have copper wire that may be damaged by a copper CMP process or overetching the bottom electrode 210 if the bottom cap layer 202 were not present to serve as an etch stop. In addition, using the bottom cap layer 202 as an etch stop maintains an integrity of dielectric layers both below the bottom cap layer 202 and also above the bottom cap layer 202 in regions between MTJ cells of an array, such as at the regions 150 of FIG. 1. By maintaining the integrity of the dielectric layers and by protecting logic areas from etching during MTJ electrode patterning, a higher yield may be obtained than may be achieved in processes where a bottom cap layer is not used as an etch stop during an MTJ patterning etch.

Figure 4:
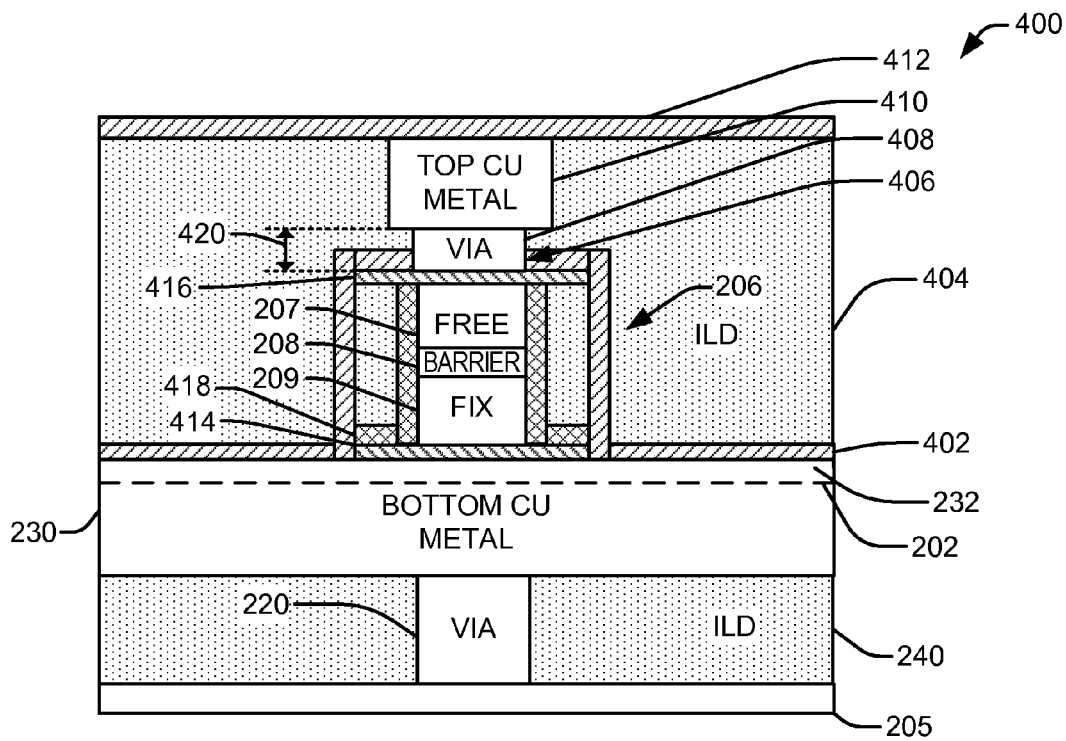
FIG. 4 is a cross-sectional diagram of a particular illustrative embodiment of a MTJ cell of FIG. 1 along the X-X' direction of FIG. 1.

Referring to FIG. 4, a cross-sectional diagram of a particular illustrative embodiment of a MTJ cell of FIG. 1 along the X-X' direction of FIG. 1 is depicted and generally designated 400. FIG. 4 illustrates the MTJ cell 400 after formation of a via 408 and a top metal wire 410. The MTJ cell 400 includes the bottom metal layer having the bottom metal landing or wire 230, the bottom conductive line 205, and the bottom via 220. The bottom ILD layer 240 is disposed on the surface of the bottom conductive line 205 and between adjacent conductive lines and is further in contact with sidewalls of the bottom via 220 and sidewalls of the bottom metal landing or wire 230. The bottom cap layer 202 (behind the bottom metal landing or wire 230 in the cross-sectional view of FIG. 4, as indicated by dashed lines) is disposed on the bottom ILD layer 240 and contacts the side portion 232 of the bottom metal layer at the sidewalls of the bottom metal landing or wire 230.

A patterned bottom electrode 414 is disposed on the bottom metal layer and the bottom cap layer 202. The MTJ stack 206 includes the free layer 207, the barrier layer 208, and the fixed layer 209 and may include one or more other layers, such as an anti-ferromagnetic layer (not shown), and is disposed an upper surface of the patterned bottom electrode 414 and protected by an inner cap layer 418. A patterned top electrode 416 is disposed on the MTJ stack 206. A middle cap layer 402 is disposed on the patterned top electrode 416 and the bottom cap layer 202. An ILD layer 404 is disposed on the middle cap layer 402.

An electrically conductive top via 408 is disposed through an opening 406 in the middle cap layer 402 and provides a conductive path between the patterned top electrode 416 and a top conductive line, such as a top metal wire 410. A protective cap layer 412 is disposed on the ILD layer 404 and the top metal wire 410.

The MTJ cell 400 may be formed from the MTJ cell 300 of FIG. 3 by performing an etch using the using the photoresist and hardmask element 312 of FIG. 3 as an etch mask, and using the bottom cap layer 202 as an etch stop. The patterned bottom electrode 414 and the patterned top electrode 416 may be formed from the bottom electrode 210 and the top electrode 310 of FIG. 3, respectively, and the inner cap layer 418 may also be formed from the second cap layer 212 during the electrode patterning etch.

The middle cap layer 402 may be deposited on the patterned top electrode 416 via a deposition process that deposits cap material to form the middle cap layer 402 over the patterned top electrode 416, along the sidewalls of the MTJ stack 206, and on the bottom cap layer 202. The ILD layer 404 may be added on the middle cap layer 402.

The top metal wire 410 and the top via 408 may be formed using a damascene process. A portion of the ILD layer 404 and the middle cap layer 402 may be opened to reach the patterned top electrode 416. As illustrated, the portion of the middle cap layer 402 that is opened to reach the patterned top electrode 416, i.e., to create the opening 406, may be part but not all of the middle cap layer 402 on the patterned top electrode 416. Thus, a photo/etch process to form the trenches or cavities in the ILD layer 404 and the opening 406 for the top metal wire 410 and the top via 408 may be performed in a manner such that the dielectric material of the ILD layer 404 and the cap material of the middle cap layer 402 are not etched simultaneously.

For example, the ILD layer 404 may be etched from the top down to form a trench for the top metal wire 410, and then may be further via photo/etched from the bottom of the trench for the top metal wire 410 to the top of the middle cap layer 402 to form a path for the top via 408 that may be dimensioned to have a cross-section that is smaller than a cross-section of the patterned top electrode 416. After reaching the top of the middle cap layer 402, the opening 406 may be etched into the middle cap layer 402 to reach the patterned top electrode 416. While the opening 406 is being etched into the middle cap layer 402, substantially no ILD layer material is being etched in the primary etch direction (i.e., in a downward direction in FIG. 4). Therefore, an integrity of the ILD layer 404 is maintained by reducing an likelihood of overetching into the ILD layer 404 due to a difference in etch rates of the middle cap layer 402 and the ILD layer 404.

After opening the middle cap layer 402 and the ILD layer 404, the top electrical via 408 may be added, and a top metal layer including the top metal wire 410 may be added. A CMP process may be performed on the top metal wire 410 and the ILD layer 404, and the protective cap layer 412 may be deposited.

The height 420 of the top via 408 is adjustable and may be varied according to a distance between the bottom metal landing or wire 230 and the top metal wire 410. By using the top via 408 and not a bottom via (i.e., the bottom electrode is deposited directly on the bottom metal landing or wire 230 rather than coupled to the bottom metal landing or wire 230 using a via through a intermediate layer), a bottom resistance of the MTJ is reduced, and an overall height of the MTJ structure including the MTJ stack 206 may be reduced. In addition, by using the top via 408 and varying height of the top via 408 to accommodate a range of distances between the top metal wire 410 and the bottom wire 230, the MTJ cell 400 may be integrated into sub-65 nm technologies. For example, if a distance between successive metal layers is too small to accommodate the MTJ cell 400, the top via 408 may simply be extended to contact a next metal layer.

Figure 5:
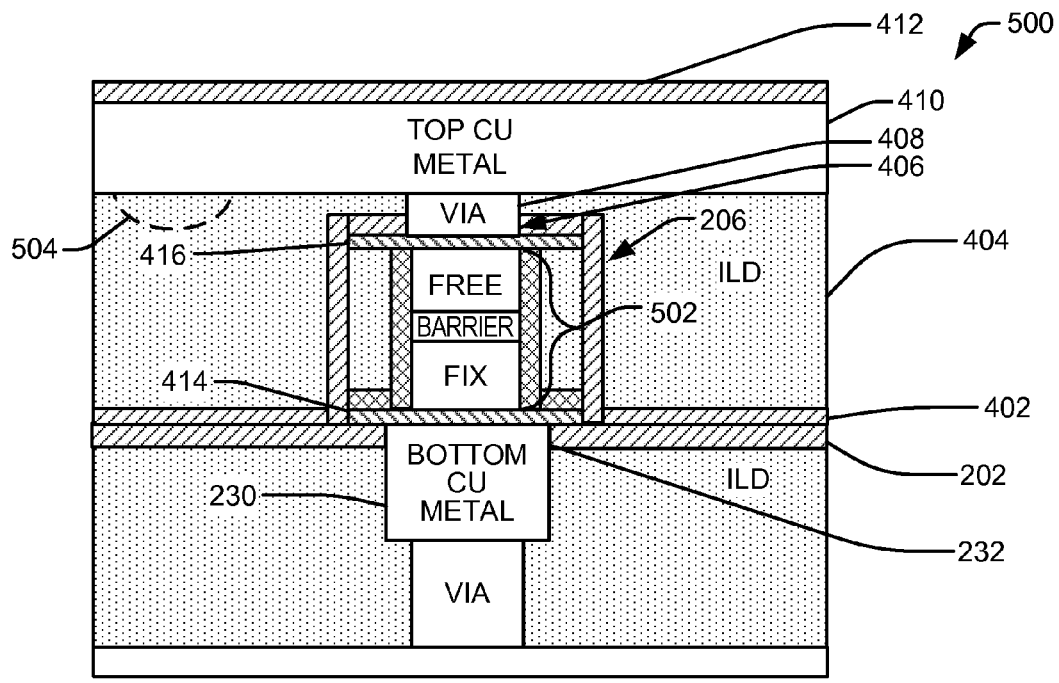
FIG. 5 is a cross-sectional diagram of a particular illustrative embodiment of a MTJ cell of FIG. 1 along the Y-Y' direction of FIG. 1.

Referring to FIG. 5, a cross-sectional diagram of a particular illustrative embodiment of a MTJ cell of FIG. 1 along the Y-Y' direction of FIG. 1 is depicted and generally designated 500. The MTJ cell 500 includes the bottom metal layer having the bottom metal landing or wire 230 with the side portion 232 in contact with the bottom cap layer 202. The MTJ stack 206 includes a MTJ structure 502 disposed between the patterned bottom electrode 414 and the patterned top electrode 416. The middle cap layer 402 is disposed on the patterned top electrode 416 and the bottom cap layer 202. The ILD layer 404 is disposed on the middle cap layer 402.

The electrically conductive top via 408 is disposed through the opening 406 to electrically connect the patterned top electrode 416 to the top metal wire 410. The protective cap layer 412 is disposed on the ILD layer 404 and the top metal wire 410. As previously discussed, starting the MTJ stack 206 from the metal wire 230 as illustrated in FIGS. 2 to 5, and starting with a top surface of the metal wire 230 substantially planar with a top surface of a bottom cap layer 202 protects dielectric layer material and logic areas. In addition, use of the top via 408 enables the metal wire 410 to be coupled to the patterned top electrode 416 using an etch that is confined to the top cap layer 402 to prevent or minimize trenches or seams that may be caused by different etch rates of the cap and IDL materials.

For example, if a trench for the top metal wire 410 were etched to enable the top metal wire 410 to contact the patterned top electrode 416 directly (without using the top via 408), the ILD layer material 404 and the middle cap layer 402 would be etched simultaneously at different rates, which may cause a trench to form at a region 504 of the ILD layer 404 due to difficult oxide gap filling and/or overetching. When metal such as copper is deposited to form the top metal wire 410, metal may also accumulate with the trench at the region 504 and potentially cause an electrical connection between the top metal wire 504 and an adjacent metal line, such as previously described with respect to the regions 150 depicted in FIG. 1.

Figure 6:
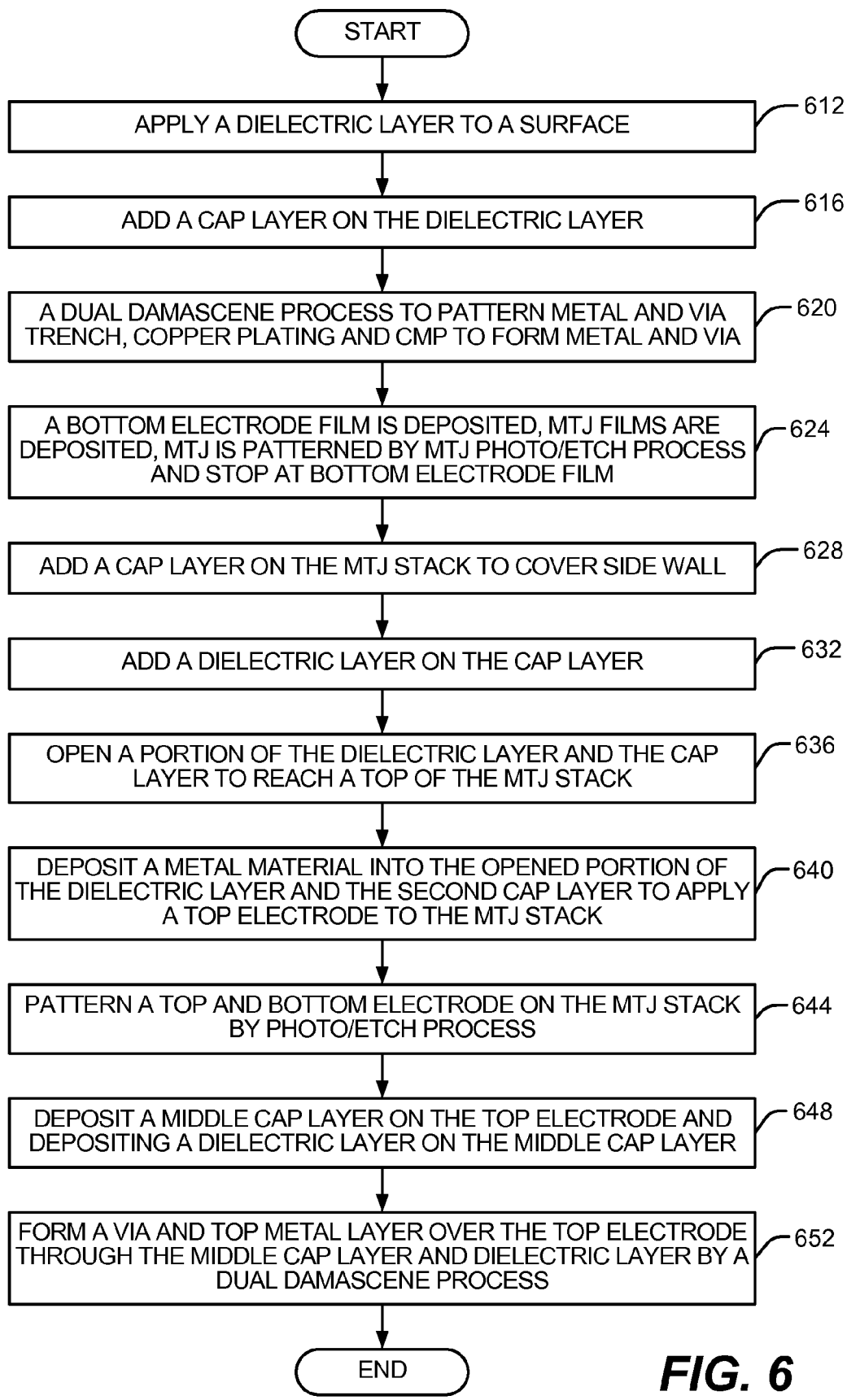
FIG. 6 is a flow diagram of a particular illustrative embodiment of a method of fabricating a magnetic tunnel junction.

FIG. 6 illustrates a flow diagram of a particular illustrative embodiment of a method of fabrication of a magnetic tunnel junction. A dielectric layer may be applied to a surface, at 612. For example, the dielectric layer may be the bottom dielectric layer 240 of FIG. 2.

Continuing to 616, a cap layer may be added on the dielectric layer. For example, the cap layer may be the bottom cap layer 202 of FIG. 2. Advancing to 620, a metal layer may be applied to the dielectric layer. The metal layer may be applied using a dual damascene process that is applied to form a metal and via trench by a photo/etch process, followed by the metal layer being plated or deposited into the resulting trench, and applying a metal CMP process to planarize a surface of the metal layer and to remove extra metal material. For example, the metal layer may include the bottom metal landing or wire 230 of FIG. 2.

Moving to 624, in a particular embodiment, a bottom electrode film is deposited, multiple MTJ films are deposited, then an MTJ is patterned by MTJ photo/etch process, where the MTJ etch process will stop at bottom electrode film. Proceeding to 628, a cap film is deposited on the MTJ to cover MTJ sidewall, a magnetic tunnel junction (MTJ) stack may be formed such that an electrode of the MTJ stack is disposed on the metal layer and the cap layer contacts a side portion of the metal layer. In a particular embodiment, the metal layer is a bottom metal layer, the electrode is a bottom electrode, and the side portion of the bottom metal layer includes a side wall. For example, the bottom electrode 414 of the MTJ stack 206 of FIG. 4 is disposed on the bottom metal landing or wire 230 and the bottom cap layer 202 contacts the side portion 232 of the bottom metal landing or wire 230. As illustrated in FIG. 4, the bottom electrode of the MTJ stack may be deposited onto a metal wire without a bottom via.

Continuing to 632, a dielectric layer may be added on the second cap layer, such as the ILD layer 242 of FIG. 2.

Advancing to 636, a portion of the dielectric layer and the second cap layer is opened to reach a top of the MTJ stack. Moving to 640, a metal material is deposited into the opened portion of the second dielectric layer and of the second cap layer to apply a top electrode to the top of the MTJ stack. Proceeding to 644, the top electrode and bottom electrode of the MTJ stack is patterned by photo/etch process. For example, the top electrode and the bottom electrode may be patterned using an etch such as described with respect to FIGS. 3-4.

Continuing to 648, a middle cap layer, such as the middle cap layer 402 of FIG. 4, may be deposited on the patterned top electrode. A dielectric layer may be added on the cap layer before opening a portion of the dielectric layer and the cap layer to add a top via.

Advancing to 652, a top electrical via and a top metal layer may be added to the patterned top electrode by a dual damascene process. For example, the top electrical via and the top metal layer may be formed using a damascene process. As illustrated in FIG. 4, portions of the dielectric layer 404 and the middle cap layer 402 including the opening 406 may be formed to reach the top patterned electrode 416 using a damascene process to add the top via 408 and the top metal wire 410 to the patterned top electrode 416.

The metal layer may be in contact with an electrical via that is formed using a damascene process, such as the top via 408 of FIG. 4. In a particular embodiment, the depth of top electrical via is adjustable or of variable depth. The top electrical via depth may be varied based on the distance between the top metal layer and a second metal layer and further based on an MTJ height, e.g. by subtracting a MTJ height, such as a distance between the bottom metal wire 230 and the top metal wire 410 subtracting the MTJ height 206 depicted in FIG. 4.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodied and carried out in connection with various hardware and software or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of fabricating a magnetic tunnel junction (MTJ) device, the method comprising:
   applying a first dielectric layer to a surface;
   applying a first cap layer to the first dielectric layer;
   removing a first portion of the first cap layer;
   removing a second portion of the first dielectric layer corresponding to the first portion;

applying a first metal layer to the removed first portion of the first cap layer and the removed second portion of the first dielectric layer to form a metal wire, wherein the first cap layer contacts a side portion of the metal wire;

forming a magnetic tunnel junction (MTJ) stack such that a bottom electrode of the MTJ stack is disposed on the metal wire;

adding a second cap layer on the MTJ stack including a MTJ stack sidewall;

adding a second dielectric layer on the second cap layer;

opening a portion of the second dielectric layer and the second cap layer to reach a top of the MTJ stack;

depositing a conductive material into the opened portion of the second dielectric layer and of the second cap layer to form a top electrode on the top of the MTJ stack;

patterning the top electrode, the second dielectric layer, and the bottom electrode of the MTJ stack such that the second cap layer remains on the MTJ stack sidewall and a remaining portion of the second dielectric layer remains on the second cap layer;

depositing a third cap layer on the patterned top electrode, on the remaining portion of the second dielectric layer, and on the first cap layer;

depositing a third dielectric layer on the third cap layer; and adding a top electrical via and a top metal layer to the patterned top electrode.

2. The method of claim 1, wherein the metal wire is a bottom metal layer and the side portion of the bottom metal layer includes a side wall.

3. The method of claim 1, further comprising selecting a height of the top electrical via.

4. The method of claim 1, wherein the top electrical via depth is selected based on a distance between the top metal layer and a second top metal layer and further based on an MTJ height of the MTJ stack.

5. The method of claim 1, wherein the top electrical via and the top metal layer are formed using a damascene process.

6. The method of claim 1, wherein the metal wire is in contact with an electrical via that is formed using a damascene process.

7. A device comprising:
a magnetic tunnel junction (MTJ) structure, wherein the MTJ structure includes a free layer, the MTJ structure comprising:
a magnetic tunnel junction (MTJ) sidewall;
a first cap layer disposed on the MTJ sidewall;
a first dielectric layer disposed on the first cap layer;
a second cap layer disposed on the first dielectric layer; and
a second dielectric layer disposed on the second cap layer, the first dielectric layer and the first cap layer having openings therein to reach the free layer of the MTJ structure;
a top electrode disposed on the free layer of the MTJ structure;
an electrical via disposed on the top electrode of the MTJ structure; and
a top metal wire disposed on the electrical via.

8. The device of claim 7, wherein the MTJ structure is an MTJ stack that comprises the free layer, a barrier layer, and a fixed layer.

9. The device of claim 7, wherein the electrical via and the top metal wire are formed with a damascene process.

10. The device of claim 7, wherein a height of the electrical via is selectable.

11. The device of claim 7, wherein a height of the electrical via is at least partially based on a distance between a first metal layer corresponding to a bottom metal wire coupled to a bottom electrode of the MTJ structure and a second metal layer corresponding to the top metal wire.

12. A method of fabricating a magnetic tunnel junction (MTJ) device, the method comprising:
forming a magnetic tunnel junction (MTJ) stack on a bottom electrode;
adding a cap layer on a top layer of the MTJ stack and on a MTJ stack sidewall;
adding a dielectric layer on the cap layer;
opening first portions of the dielectric layer and the cap layer to reach a top layer of the MTJ stack;
depositing an electrical material into the opened first portions of the dielectric layer and of the cap layer to form a top electrode on the top layer of the MTJ stack; and
patterning the top electrode, the dielectric layer, and the bottom electrode of the MTJ stack such that the cap layer remains on the MTJ stack sidewall and a remaining portion of the dielectric layer remains on the cap layer.

13. The method of claim 12, further comprising:
adding a second cap layer on the patterned top electrode and the remaining portion of the dielectric layer.

14. The method of claim 13, further comprising:
adding a second dielectric layer on the second cap layer.

15. The method of claim 14, further comprising:
removing second portions of the second dielectric layer and the second cap layer to expose a portion of the patterned top electrode; and
forming an electrical via on the exposed portion of the patterned top electrode.

16. The method of claim 12, further comprising forming a top metal wire on the electrical via.

17. The method of claim 16, wherein the electrical via and the top metal wire are formed using a damascene process.

18. The method of claim 12, wherein the top layer of the MTJ stack is a free layer.

19. The method of claim 15, further comprising selecting a height of the electrical via.

20. The method of claim 19, wherein the height of the electrical via is selected based on an MTJ height of the MTJ stack.

21. A magnetic tunnel junction (MTJ) structure comprising:
a magnetic tunnel junction (MTJ) stack;
a magnetic tunnel junction (MTJ) stack sidewall;
a first cap layer disposed on the MTJ stack sidewall;
a first dielectric layer disposed on the first cap layer;
a second cap layer disposed on the first dielectric layer; and
a second dielectric layer disposed on the second cap layer.

22. The MTJ structure of claim 21, wherein the MTJ stack is disposed on a bottom electrode, the MTJ structure further comprising a top electrode disposed on the MTJ stack.

23. The MTJ structure of claim 22, wherein the second cap layer is disposed on the top electrode, wherein a portion of the second cap layer is open to expose the top electrode.

24. The MTJ structure of claim 21, wherein a top layer of the MTJ stack is a free layer.

* * * * *